US00RE48041E

(19) United States
(12) Reissued Patent
Wu

(10) Patent Number: US RE48,041 E
(45) Date of Reissued Patent: Jun. 9, 2020

(54) SUPPORTING APPARATUS OF HOUSING

(71) Applicants: SENSEAGE CO., LTD., Taipei (TW); SOLUTION EXPERT 33 INTERNATIONAL CO., LTD. TAIWAN BRANCH (B.V.I.), New Taipei (TW); DONGGUAN SOLUTION 33 ELECTRONIC TECHNOLOGY CO., LTD., Dongguan, Guangdong (CN); SOLUTION EXPERT 33 INTERNATIONAL CO., LTD., Tortola (VG)

(72) Inventor: Da-Chung Wu, Taipei (TW)

(73) Assignees: SENSEAGE CO., LTD., Taipei (TW); SOLUTION EXPERT 33 INTERNATIONAL CO., LTD. TAIWAN BRANCH (B.V.I.), New Taipei (TW); DONGGUAN SOLUTION 33 ELECTRONIC TECHNOLOGY CO., LTD., Guangdong (CN); SOLUTION EXPERT 33 INTERNATIONAL CO., LTD. (VG)

(21) Appl. No.: 16/400,041

(22) Filed: May 1, 2019

Related U.S. Patent Documents

Reissue of:
(64) Patent No.: 9,730,345
Issued: Aug. 8, 2017
Appl. No.: 14/962,652
Filed: Dec. 8, 2015

U.S. Applications:
(63) Continuation-in-part of application No. 14/168,510, filed on Jan. 30, 2014, now abandoned.

(51) Int. Cl.
*F16M 11/10* (2006.01)
*F16M 11/38* (2006.01)
(Continued)

(52) U.S. Cl.
CPC ..... *F16M 11/10* (2013.01); *F16M 11/105* (2013.01); *F16M 11/38* (2013.01);
(Continued)

(58) Field of Classification Search
CPC ..... F16M 11/10; F16M 11/38; F16M 13/00; F16M 11/105; F16M 13/04;
(Continued)

(56) References Cited

U.S. PATENT DOCUMENTS 2,490,356 A 12/1949 Hummel
3,195,850 A 7/1965 Steiner
(Continued)

FOREIGN PATENT DOCUMENTS

CN 2615723 Y 5/2004
CN 202257396 U 5/2012
(Continued)

OTHER PUBLICATIONS

Evaluation Report of Utility Model Patent issued by State Intellectual Property Office of China on Feb. 18, 2016.
(Continued)

*Primary Examiner* — William C Doerrler
(74) *Attorney, Agent, or Firm* — Chun-Ming Shih; HDLS IPR Services

(57) ABSTRACT

A housing supporting apparatus includes: a base-plate body having a base-plate axis; a connection plate body having one end formed with a connection plate axis and pivotally connected to one end of the base-plate body; a first supporting plate having a first axis pivotally connected to the one end of the connection plate body; and a second supporting plate having a second axis pivotally connected to one end of the first supporting plate. The second supporting plate has one end pivotally connected to the base-plate axis.

19 Claims, 10 Drawing Sheets

(51) Int. Cl.

| | |
|---|---|
| ***F16M 13/00*** | (2006.01) |
| ***H05K 5/00*** | (2006.01) |
| ***H05K 5/02*** | (2006.01) |
| ***G06F 1/16*** | (2006.01) |
| ***F16M 13/04*** | (2006.01) |
| ***A45C 11/00*** | (2006.01) |

(52) U.S. Cl.
CPC ..... *F16M 13/00* (2013.01); *F16M 13/04* (2013.01); *G06F 1/166* (2013.01); *G06F 1/1626* (2013.01); *H05K 5/0086* (2013.01); *H05K 5/0234* (2013.01); *A45C 2011/002* (2013.01); *A45C 2011/003* (2013.01); *A45C 2200/15* (2013.01); *G06F 2200/1633* (2013.01)

(58) Field of Classification Search
CPC .. H05K 5/0234; H05K 5/0086; G06F 1/1626; G06F 1/166; G06F 2200/1633; A45C 2011/002; A45C 2011/003; A45C 2200/15
See application file for complete search history.

(56) References Cited

U.S. PATENT DOCUMENTS

| | | | | |
|---|---|---|---|---|
| 4,770,385 | A | 9/1988 | Bahm | |
| 4,886,231 | A | 12/1989 | Doerksen | |
| 5,722,628 | A | 3/1998 | Menaged | |
| 7,595,930 | B2 * | 9/2009 | Adams | G03B 21/58 359/443 |
| 8,282,065 | B1 * | 10/2012 | Stone | A47B 23/044 16/221 |
| 8,434,601 | B2 | 5/2013 | Hou et al. | |
| 8,640,864 | B2 | 2/2014 | Chen et al. | |
| 8,724,300 | B2 * | 5/2014 | Smith | G06F 1/1628 206/320 |
| 8,955,815 | B2 * | 2/2015 | White | F16M 11/10 206/30 |
| 9,033,147 | B2 * | 5/2015 | Lee | A45C 11/00 206/320 |
| 9,310,835 | B2 * | 4/2016 | Bryan | A45C 13/1069 |
| 9,540,134 | B2 * | 1/2017 | Melmon | B65D 5/5206 |
| 9,545,139 | B2 * | 1/2017 | Kim | A45C 11/00 |
| 2003/0213886 | A1 * | 11/2003 | Gilbert | A47B 23/044 248/454 |
| 2012/0181410 | A1 * | 7/2012 | Ku | A47B 23/042 248/453 |
| 2012/0248277 | A1 * | 10/2012 | Yang | A47B 23/044 248/346.3 |
| 2013/0062248 | A1 * | 3/2013 | Huang | B65D 37/00 206/756 |
| 2013/0187023 | A1 | 7/2013 | Renwick | |
| 2013/0241381 | A1 | 9/2013 | Hynecek et al. | |
| 2015/0136933 | A1 * | 5/2015 | Merzon | G06F 1/1626 248/450 |

FOREIGN PATENT DOCUMENTS

| | | | |
|---|---|---|---|
| CN | 202635923 | U | 1/2013 |
| TW | 201132560 | A1 | 10/2011 |

OTHER PUBLICATIONS

Official report issued by Taiwan Intellectual Property Office on Apr. 20, 2016.

* cited by examiner

SUPPORTING APPARATUS OF HOUSING

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application is a continuation-in-part (CIP) of application Ser. No. 14/168,510, filed on Jan. 30, 2014, which is incorporated herewith by reference.

BACKGROUND OF THE INVENTION (1) Field of the Invention

The invention relates to a supporting apparatus of a housing, and more particularly to a housing supporting apparatus applicable to a tablet or a smart phone.

(2) Description of the Prior Art

At present, most of the supporting structures applied to the tablet devices utilize a housing combined with a supporting structure to form the support. The supporting structures for the available products pertain to the externally independent structures, and the users feel inconvenient when carrying or using the supporting structures.

Furthermore, another product has the housing combined with the protection sheath structure formed by the front and rear plate bodies, and the front and rear plate bodies cover the front side and backside of the tablet device to achieve the protection effect. The front plate body has a folding line for the user to turn over the front plate body behind the tablet device to form the support. Alternatively, the folding line is formed on the connection portion between the rear plate body and the housing, so that the user can turn over the rear plate body to make the tablet device stand on the front plate body to form the support. However, no matter which mode of protection sheath is used, the externally independent supporting apparatus is still used to support the tablet device, such as a tablet, a personal digital assistant (PDA), a smart phone or the like. Therefore, there are more external components, and the overall weight and thickness of the tablet device are increased to increase the loading of the user who is carrying and using the device. In addition, using the supporting structure, formed after turning over the plate body, requires the sufficient plane space for the placement of the supported tablet device, so that the use environment is correspondingly restricted.

SUMMARY OF THE INVENTION

Most of the known tablet device supporting structures utilize a component external to a housing to achieve the supporting effect, and cannot easily satisfy the slim and light and portable requirements of the user on the handheld digital device (tablet device).

Therefore, it is necessary to develop a housing supporting apparatus for supporting a tablet device without increasing the user's loading. The housing supporting apparatus can provide the supporting effect upon use, and can be easily retracted and stored in the housing when not used to decrease the user's carry loading so that the housing supporting apparatus can be applied to the more diversified environment.

A housing supporting apparatus of the invention includes: a base-plate body having a base-plate axis; a connection plate body having one end, which is formed with a connection plate axis and pivotally connected to one end of the base-plate body; a first supporting plate having a first axis pivotally connected to the one end of the connection plate body; and a second supporting plate having a second axis pivotally connected to one end of the first supporting plate, wherein one end of the second supporting plate is pivotally connected to the base-plate axis.

One face of the base-plate body is fixed on a housing, and the base-plate axis and the connection plate axis are respectively disposed at the opposite two sides of the base-plate body; the connection plate axis and the first axis are respectively disposed at the opposite two sides of the connection plate body; the first axis and the second axis are disposed at the opposite two sides of the first supporting plate, and the second axis and the base-plate axis are disposed at the opposite two sides of the second supporting plate; besides, the base-plate axis, the connection plate axis, the first axis and the second axis are parallel with one another, such that the base-plate body, the connection plate body, the first supporting plate and the second supporting plate are connected to form a ring-shaped body.

By means of the above structure, the base-plate body and the connection plate body are the inner-layer plate set, and the first supporting plate and the second supporting plate are the outer-layer plate set; the total length of the inner-layer plate set is substantially equal to the total length of the outer-layer plate set, and the length of the connection plate body is smaller than the length of the base-plate body, such that the connection plate body is able to be folded by pivoting on the connection plate axis so as to selectively be located at the corresponding position; under the unfolded status, the connection plate body is located on the housing, and the outer-layer plate set parallel covers the inner-layer plate set opposite to other side of the housing; under the folded status, the connection plate body is located on the base-plate body and opposite to the other side of the housing, such that the first supporting plate and the second supporting plate are tilted toward outside to provide the supporting effect.

Preferably, the housing is formed with an accommodating slot, and the base-plate body is disposed at the accommodating slot; under the unfolded status, the accommodating slot can accommodate the base-plate body, the connection plate body, the first supporting plate and the second supporting plate.

Preferably, the length of the first supporting plate is substantially equal to the length of the second supporting plate, and the length of the connection plate body is substantially equal to 30-70% of the total length of the first supporting plate.

Preferably, the connection plate body is selectively located at the corresponding position of the housing by magnetic force so as to increase the convenience in use.

The effect of the invention can provide the design of the foldable housing supporting apparatus for the user to support his/her tablet device. The housing supporting apparatus can have the first supporting plate and the second supporting plate folded to provide the supporting effect upon use, and can also be stored in the accommodating slot of the housing when not used, thereby decreasing the loading of carrying the tablet device; besides, when the connection plate body has yet to be located, the user can use the ring-shaped plate body structure to wear the apparatus on his/her or thenar of fingers, so the user does not need to hold the tablet device, which can effectively reduce the user's loading and is more convenient in use.

Preferably, the first supporting plate further comprises a first right side and a first left side, and the slope of the first right side may be equal to, greater than or smaller than that of the first left side. Thus, the user can select the suitable slope according to the requirement, and the same or different slanting effects can be generated when the user uses the tablet device in the transversal standing state, thereby enhancing the comfort in use.

Preferably, the second supporting plate further comprises a second right side and a second left side, and the second right side and the second left side may also correspond to the first right side and the first left side to enhance the stability of supporting the tablet device upon use.

According to the above structure, the user can also adjust the tilt effect of horizontal supporting standing via a V-shaped right lateral side matched by a first right side of the first supporting plat and a second right side of the second supporting plate; also, a V-shaped left lateral side can be matched by a first left side of the first supporting plat and a second left side of the second supporting plate; the user can adjust the slope of the first right side to be equal, greater than or smaller than the slope of the first left side so as to from different designs with different tilt angles and better the adaptability.

Further aspects, objects, and desirable features of the invention will be better understood from the detailed description and drawings that follow in which various embodiments of the disclosed invention are illustrated by way of examples.

DETAILED DESCRIPTION OF THE PREFERRED EMBODIMENTS

Figure 1:
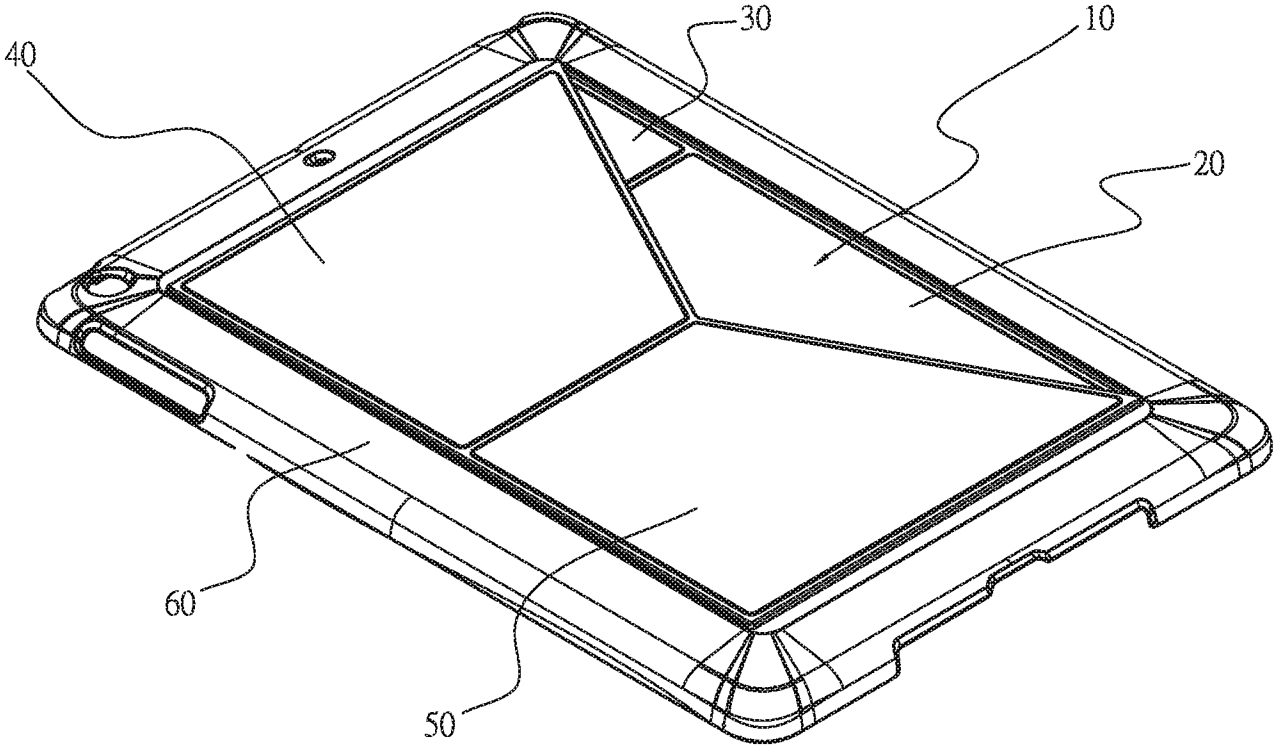
FIG. 1 is a pictorial view of the invention (unfolded status).
Figure 2:
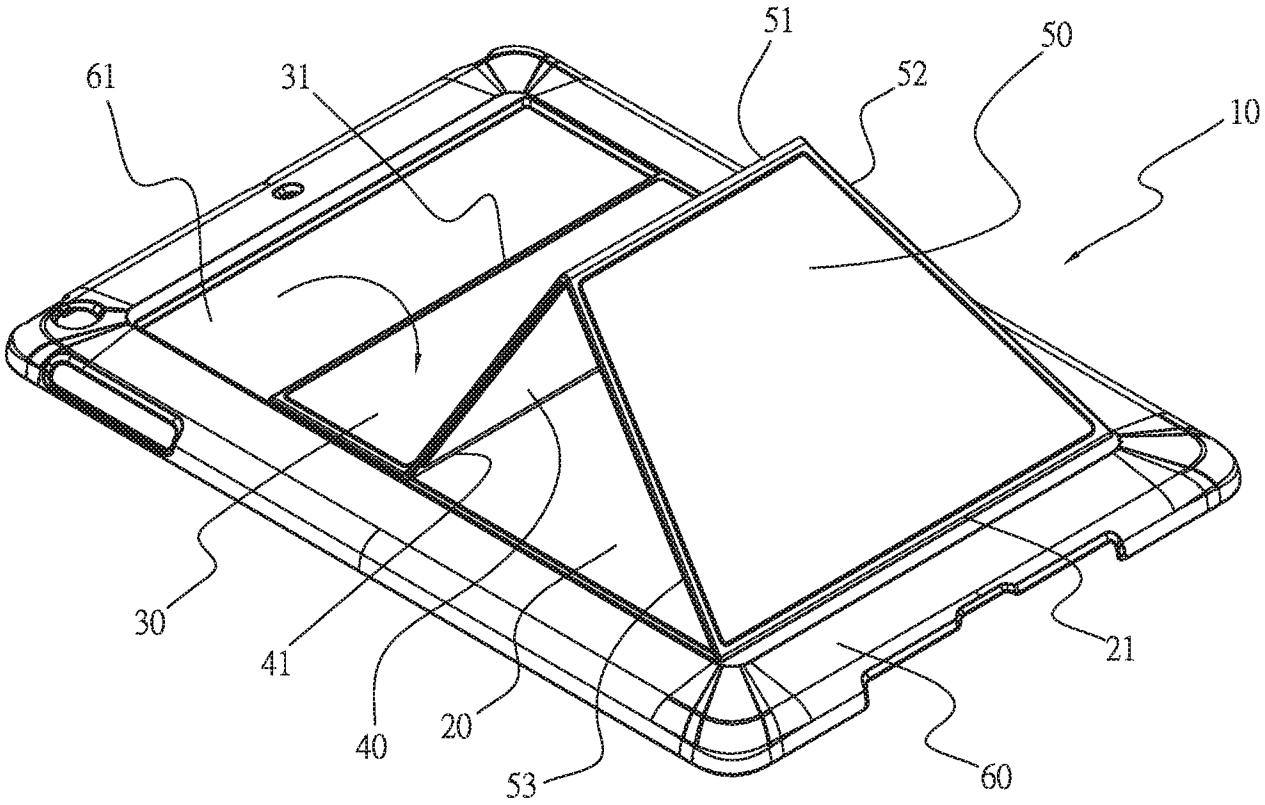
FIG. 2 is a pictorial view of the invention (folded status).

Referring to the pictorial view of FIG. 1 of the invention and the pictorial view of FIG. 2 of the invention after being folded, a housing supporting apparatus 10 of the invention has the main components including: a base-plate body 20 having a base-plate axis 21; a connection plate body 30 having one end formed with a connection plate axis 31 and pivotally connected to one end of the base-plate body 20; a first supporting plate 40 having a first axis 41 pivotally connected to the one end of the connection plate body 30; and a second supporting plate 50 having a second axis 51 pivotally connected to one end of the first supporting plate 40, and one end of the second supporting plate 50 is pivotally connected to the base-plate axis 21.

Figure 13:
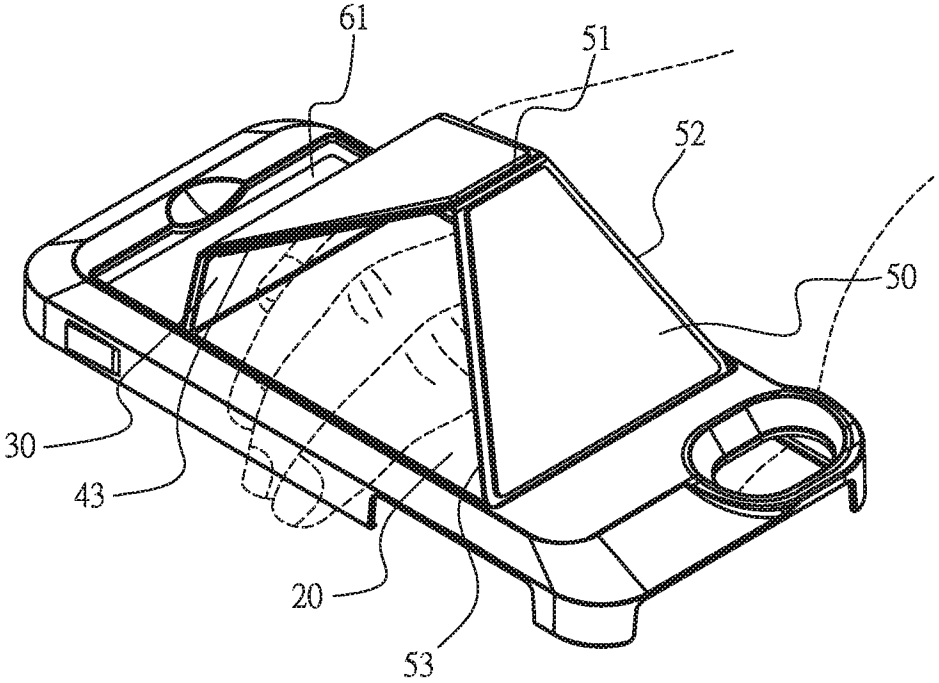
FIG. 13 is a schematic view of the carrying status of the invention.

More specifically, one face of the base-plate body 20 is fixed on a housing 60, and the base-plate axis 21 and the connection plate axis 31 are respectively disposed at the opposite two sides of the base-plate body 20; the connection plate axis 31 and the first axis 41 are respectively disposed at the opposite two sides of the connection plate body 30; the first axis 41 and the second axis 51 are disposed at the opposite two sides of the first supporting plate 40, and the second axis 51 and the base-plate axis 21 are disposed at the opposite two sides of the second supporting plate 20; besides, the base-plate axis 21, the connection plate axis 31, the first axis 41 and the second axis 51 are parallel with one another, such that the base-plate body 20, the connection plate body 30, the first supporting plate 40 and the second supporting plate 50 are connected to form a ring-shaped body; in this way, the user can penetrate his/her fingers or thenar through the ring-shaped body (as shown in FIG. 13) for the user to conveniently hold the apparatus.

It is to be noted that the pivotal connection disclosed in this invention includes, but without limitation to, performing the flexural stress concentration between two constituent elements in a thinned manner. This means that the maximum deformation is generated using a thinned portion to have the bending or folding effect. In detail, despite whether the base-plate body 20, the connection plate body 30, the first supporting plate 40 and the second supporting plate 50 are made of the same material, the flexural stress concentration can be performed in the thinned manner. This effect causes the two constituent elements to generate the bending or folding effect, as shown in FIG. 2. Furthermore, the invention also does not exclude other methods from performing the pivotal connection. For example, the pivotal connection effect can be achieved using a rotating shaft or the deformation amount of the material itself.

Figure 3:
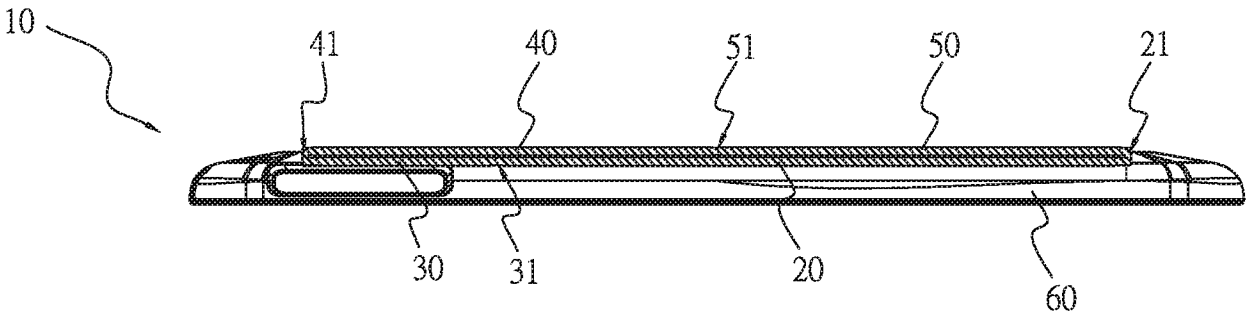
FIG. 3 is a cross-sectional view of the invention (unfolded status).
Figure 4:
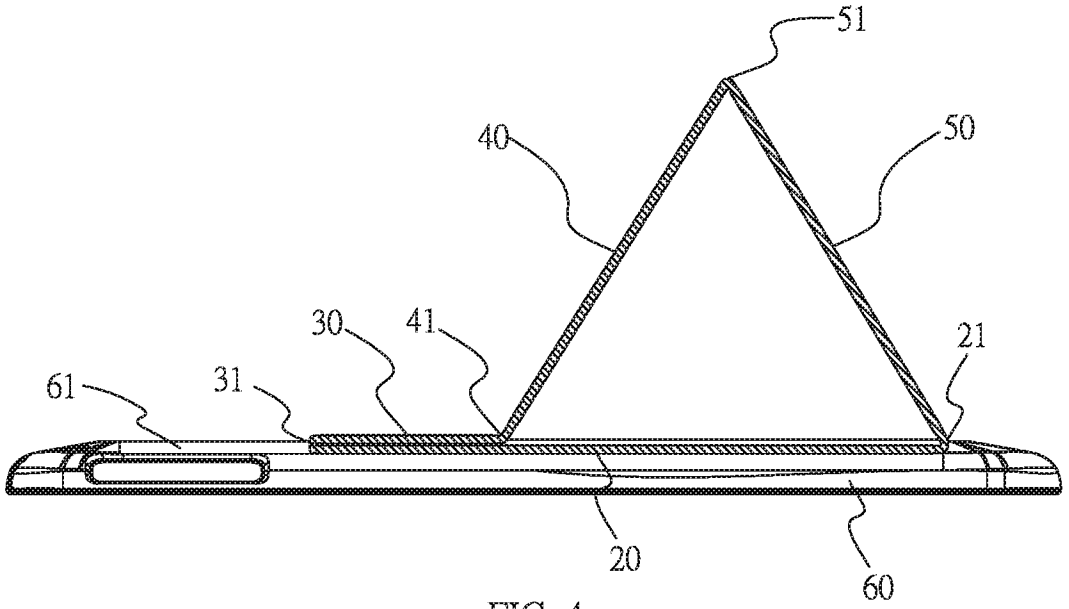
FIG. 4 is a cross-sectional view of the invention after being folded (folded status).
Figure 5:
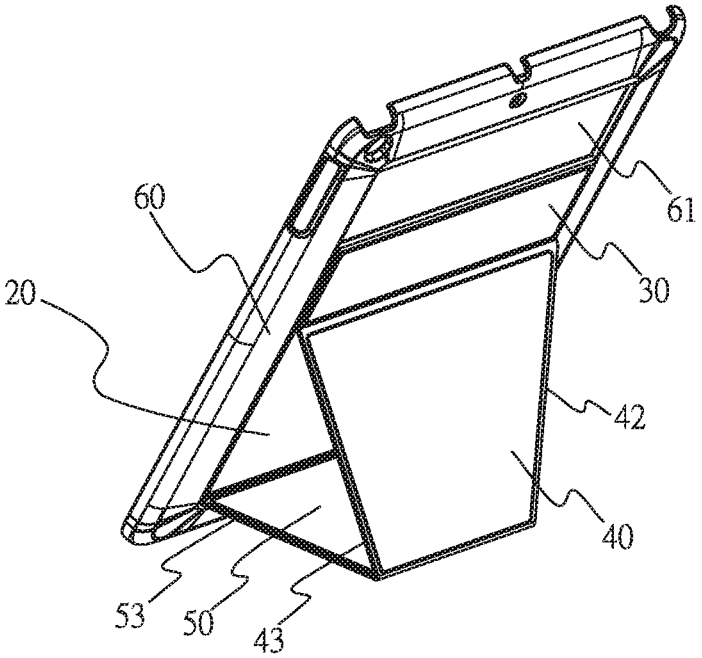
FIG. 5 is a pictorial view of the invention at another viewing angle (in-use status).
Figure 6:
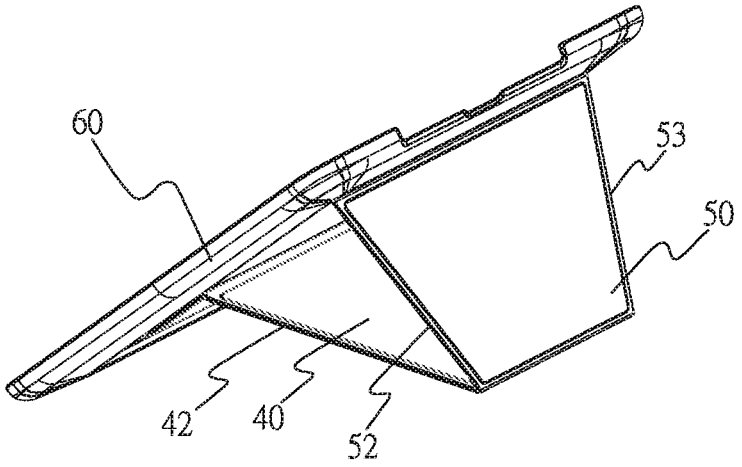
FIG. 6 is a pictorial view of the invention at another viewing angle (in-use status).
Figure 7:
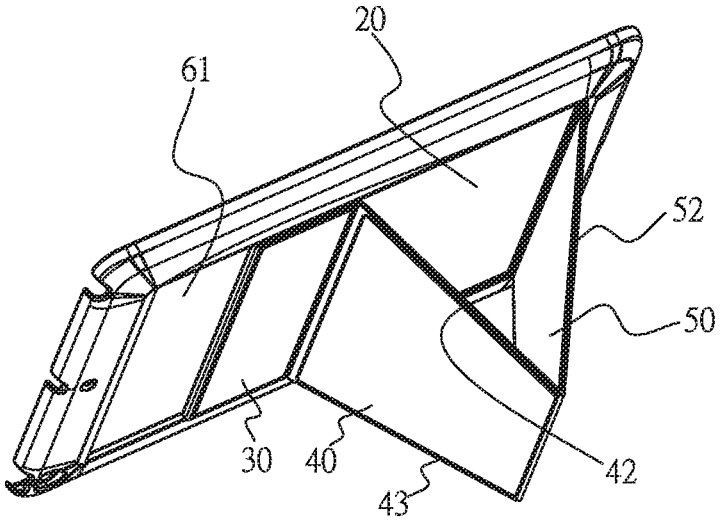
FIG. 7 is a pictorial view of the invention at another viewing angle (in-use status).
Figure 8:
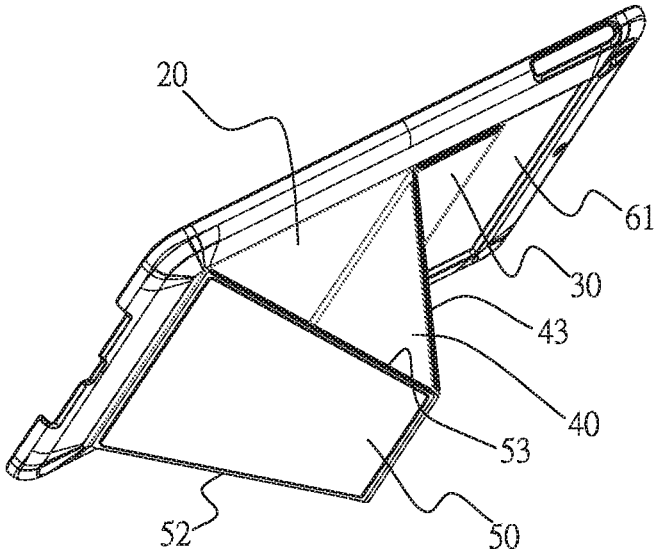
FIG. 8 is a pictorial view of the invention at another viewing angle (in-use status).

Please refer to the cross-sectional view of FIG. 3 of the invention and the cross-sectional view of FIG. 4 of the invention after being folded. Before the housing supporting apparatus 10 of the invention deforms, the one end of the first supporting plate 40 of the invention is pivotally connected to the second supporting plate 50 through the second axis 51. In addition, the one end of the connection plate body 30 is pivotally connected to the one end of the base-plate body 20 through the connection plate axis 31. The first axis 41 is pivotally connected to one end of the connection plate body 30, and the other end of the base-plate body 20 is pivotally connected to the second supporting plate 50.

As shown in FIG. 3, the base-plate body 20 and the connection plate body 30 can be defined as the inner-layer plate set, and the first supporting plate 40 and the second supporting plate 50 can be defined as the outer-layer plate set; under the unfolded status, the inner-layer plate set and the outer-layer plate set are spread, and the connection plate body 30 is directly located on the housing 60; besides, the outer-layer plate set parallel covers the other side of the housing 60 opposite to the inner-layer plate set. Further, as shown in FIG. 4, under the folded status, the connection plate body 30 is located on the base-plate body 20 and opposite to the other side of the housing 60, such that the first supporting plate 40 and the second supporting plate 50 can tilt toward outside to provide the supporting effect.

In this invention, the distance between the axes of the both sides of each plate body can be defined as the length of each plate body; in a feasible embodiment, the total length of the inner-layer plate set is substantially equal to the total length of the outer-layer plate set, and the length of the connection plate body 30 is smaller than the length of the base-plate body 20; also, in the outer-layer plate set, the length of the first supporting plate 40 can be substantially equal to the length of the second supporting plate 50; besides, the length of the connection plate body 30 is preferably between 30-70% of the total length of the first supporting plate 40.

In this invention, the connection plate body 30 may be composed of a permanent magnet. As shown in FIG. 1 and FIG. 2 representing the folded state, the connection plate body 30 may be folded toward the folding direction A by pivoting upon the connection plate axis 31 and then tightly connected to a housing 60 made of any metal via magnetic force. The personal digital assistant (PDA), tablet or smart phone can achieve the effect of supporting the digital product according to the disclosure of this invention without difficulty. Preferably, as shown in FIG. 2, the housing 60 may be formed with an accommodating slot 61. Consequently, when this invention is under the unfolded status, as shown in the state of FIG. 3, the overall thickness cannot be increased.

Please refer to the pictorial views of FIGS. 5 to 8 of the invention at another viewing angle. FIGS. 5 to 8 represent the state where the folding function of the invention is enabled. The accommodating slot 61 of the housing 60 may just accommodate all constituent elements of the invention. When the folding function of the invention is enabled, the accommodating slot 61 needs to expose a small space approaching the connection plate body 30.

The connection plate body 30 may be substantially constituted by a permanent magnet. Preferably, the outer surface of the connection plate body 30 may also be covered with a rubber or plastic layer to make the connection plate body 30 and other constituent elements have the same material.

Figure 9:
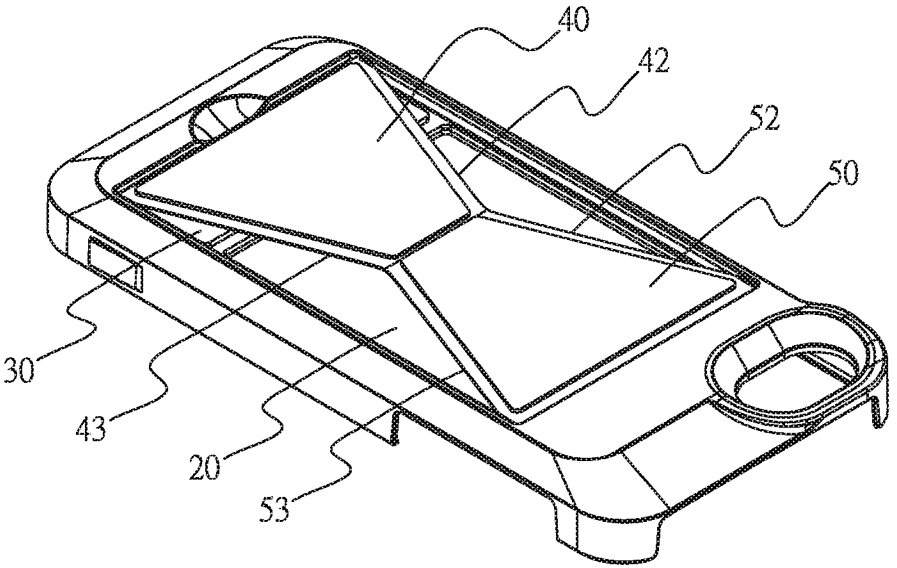
FIG. 9 is a pictorial view of another embodiment of the invention (unfolded status).
Figure 10:
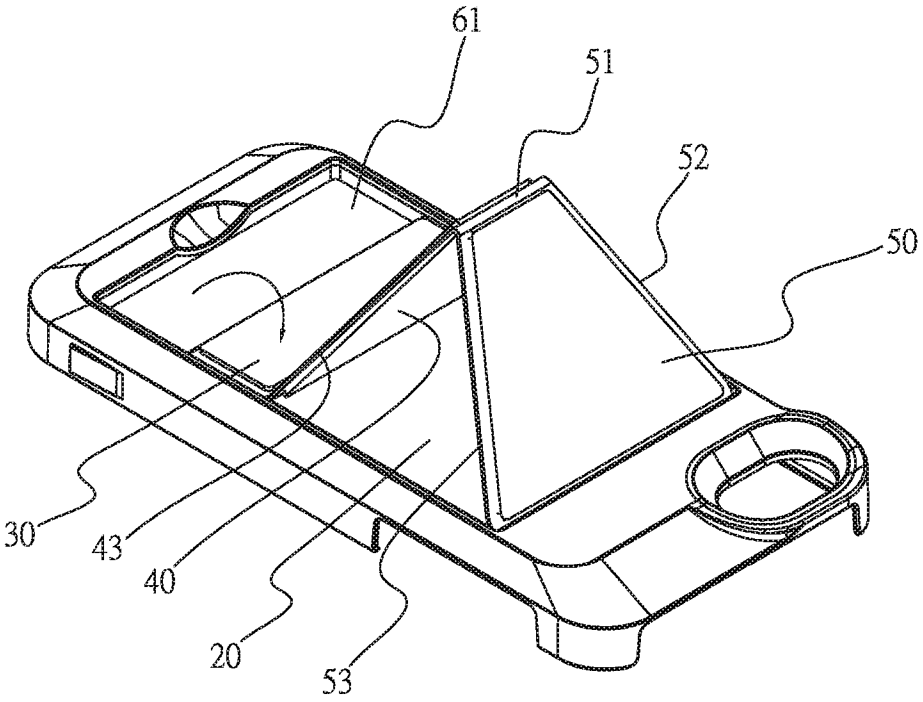
FIG. 10 is a pictorial view of another embodiment of the invention after being folded (folded status).

Please refer to the pictorial view of FIG. 9 of the invention and the pictorial view of FIG. 10 of the invention after being folded. The first supporting plate 40 further includes a first right side 42 and a first left side 43. The second supporting plate 50 further includes a second right side 52 and a second left side 53.

Figure 11:
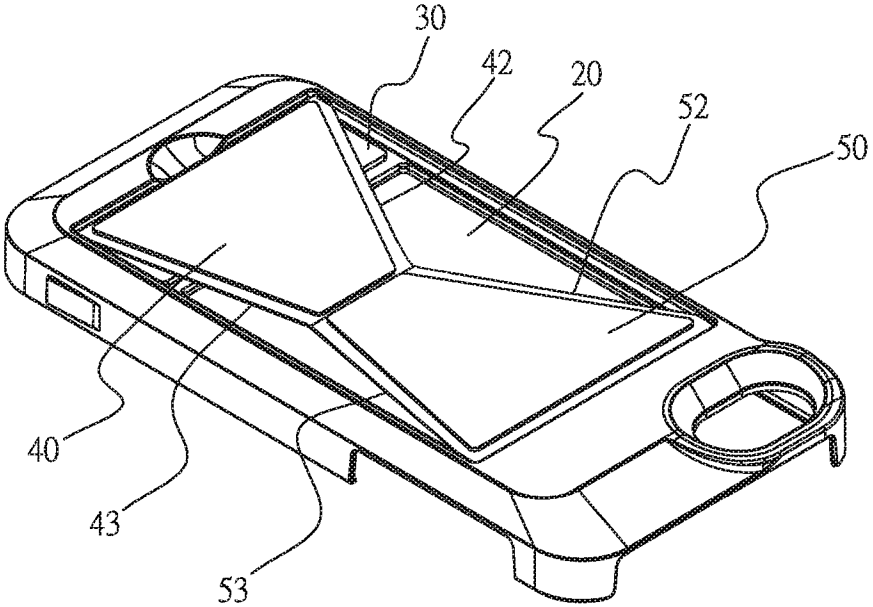
FIG. 11 is a pictorial view of still another embodiment of the invention (unfolded status).

Please refer to pictorial views of FIGS. 9 and 11 of the invention of another embodiment and compare FIG. 9 with FIG. 11. The slope of the first right side 42 of the invention may be configured to be greater than that of the first left side 43. Alternatively, the slope of the first right side 42 may be configured to be smaller than that of the first left side 43. The slope of the second right side 52 of the invention may be configured to be greater than that of the second left side 53. Alternatively, the slope of the second right side 52 may be configured to be smaller than that of the second left side 53.

Please refer to FIG. 9 and compare FIG. 9 with FIG. 11, the invention may constitute a V-shaped right lateral side according to the matching of the slopes of the first right side 42 and the second right side 52. Similarly, the invention may constitute a V-shaped left lateral side according to the matching of the slopes of the first left side 43 and the second left side 53.

As shown in FIG. 9, the first right side 42 and the second right side 52 have the same slope, the first left side 43 and the second left side 53 also have the same slope, the first right side 42 and the first left side 43 also have the same slope, and the second right side 52 and the second left side 53 also have the same slope. Consequently, the invention has the symmetrical effect in the exterior shape.

As shown in FIG. 11, the first right side 42 and the second right side 52 have the same slope, and the first left side 43 and the second left side 53 also have the same slope. However, the first right side 42 and the first left side 43 have different slopes, and the second right side 52 and the second left side 53 have different slopes. Consequently, the invention has the symmetrical effect in the exterior shape.

Figure 12:
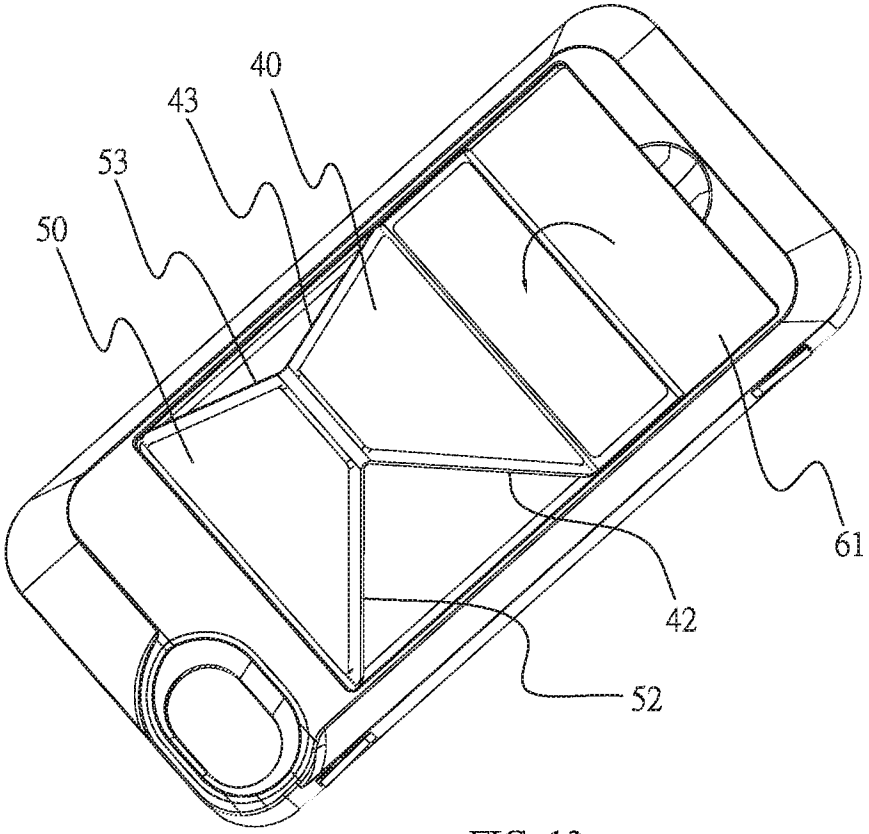
FIG. 12 is a pictorial view of still another embodiment of the invention after being folded (folded status).

Please refer to the pictorial view of FIG. 1 of the invention and the pictorial view of FIG. 12 of another embodiment of the invention after being folded, the base-plate body 20 may be made of a metal, plastic or rubber material. As disclosed hereinabove, the connection plate body 30 is composed of the permanent magnet, but may have equivalence implemented by way of pseudo mounting or adsorption. The first supporting plate 40 is made of the metal, plastic or rubber material, and the second supporting plate 50 is made of the metal, plastic or rubber material.

New characteristics and advantages of the invention covered by this document have been set forth in the foregoing description. It is to be expressly understood, however, that the drawings are for the purpose of illustration only and are not intended as a definition of the limits of the invention. Changes in methods, shapes, structures or devices may be made in details without exceeding the scope of the invention by those who are skilled in the art. The scope of the invention is, of course, defined in the language in which the appended claims are expressed.

What is claimed is:

1. A housing supporting apparatus applicable to a housing, comprising a [base plate] *base-plate body*, a connection plate body, a first support plate, and a second supporting plate, wherein:

a face side of the base-plate body is *entirely* fixed on the housing, and an edge side of the base-plate body is pivotally connected to an edge side of the connection plate body via a connection plate axis, and an opposite edge side of the base-plate body is pivotally connected to an edge side of the second supporting plate via a base-plate axis;

the connection plate body is pivotally connected to an edge side of the first supporting plate via a first axis at an opposite edge side of the connection-plate axis;

the first supporting plate [at the] is connected to an edge side of the second supporting plate via a second axis at an opposite edge side of the first axis; and the base-plate axis and the second axis are at two opposite sides of the second supporting plate*, respectively*;

[wherein,] the base-plate axis, the connection plate axis, the first axis and the second axis are parallel with one another, such that the base-plate body, the connection plate body, the first supporting plate and the second supporting plate are connected to form a ring-shaped body;

[also,] the base-plate body and the connection plate body are an inner-layer plate set, and the first supporting plate and the second supporting plate are an outer-layer plate set; a total length of the inner-layer plate set is substantially equal to a total length of the outer-layer plate set, and a length of the connection plate body is smaller than a length of the base-plate body, such that the connection plate body is able to be folded by pivoting on the connection plate axis so as to selectively be located at a corresponding position;

under an unfolded status, the connection plate body is located on the housing, and the outer-layer plate set is parallel to and covers the inner-layer plate set opposite to other side of the housing; and under a folded status, the connection plate body is located on the base-plate body and opposite to the other side of the housing, such that the first supporting plate and the second supporting plate are tilted toward an outside to provide a supporting effect.

2. The apparatus according to claim 1, wherein a V-shaped right lateral side is matched by a first right side of the first supporting plate and a second right side of the second supporting plate.

3. The apparatus according to claim 2, wherein a V-shaped left lateral side which is opposite to the V-shaped right lateral side is matched by a first left side of the first supporting plate and a second left side of the second supporting plate.

4. The apparatus according to claim 2, wherein a slope of the first right side is equal to, greater than, or smaller than a slope of the first left side.

5. The apparatus according to claim 1, claim 2 or claim 3, wherein the connection plate body is selectively located at the corresponding position of the housing by a magnetic force.

6. The apparatus according to claim 5, wherein the housing is formed with an accommodating slot, and the base-plate body is disposed at the accommodating slot; under the unfolded status, the accommodating slot accommodates the base-plate body, the connection plate body, the first supporting plate and the second supporting plate.

7. The apparatus according to claim 6, wherein a length of the first supporting plate is substantially equal to a length of the second supporting plate, and the length of the connection plate body is substantially equal to 30-70% of a total length of the first supporting plate.

8. The apparatus according to claim 7, wherein the connection plate body is composed of a permanent magnet.

9. The apparatus according to claim 7, wherein the base-plate body, the first supporting plate and a second supporting plate are made of a metal, plastic or rubber material.

*10. The apparatus according to claim 2, wherein the connection plate body is selectively located at the corresponding position of the housing by a magnetic force.*

*11. The apparatus according to claim 3, wherein the connection plate body is selectively located at the corresponding position of the housing by a magnetic force.*

*12. The apparatus according to claim 10, wherein the housing is formed with an accommodating slot, and the base-plate body is disposed at the accommodating slot; under the unfolded status, the accommodating slot accommodates the base-plate body, the connection plate body, the first supporting plate and the second supporting plate.*

*13. The apparatus according to claim 11, wherein the housing is formed with an accommodating slot, and the base-plate body is disposed at the accommodating slot; under the unfolded status, the accommodating slot accommodates the base-plate body, the connection plate body, the first supporting plate and the second supporting plate.*

*14. The apparatus according to claim 12, wherein a length of the first supporting plate is substantially equal to a length of the second supporting plate, and the length of the connection plate body is substantially equal to 30-70% of a total length of the first supporting plate.*

*15. The apparatus according to claim 13, wherein a length of the first supporting plate is substantially equal to a length of the second supporting plate, and the length of the connection plate body is substantially equal to 30-70% of a total length of the first supporting plate.*

*16. The apparatus according to claim 14, wherein the connection plate body is composed of a permanent magnet.*

*17. The apparatus according to claim 15, wherein the connection plate body is composed of a permanent magnet.*

*18. The apparatus according to claim 14, wherein the base-plate body, the first supporting plate and a second supporting plate are made of a metal, plastic or rubber material.*

*19. The apparatus according to claim 15, wherein the base-plate body, the first supporting plate and a second supporting plate are made of a metal, plastic or rubber material.*

* * * * *